(12) United States Patent
No

(10) Patent No.: US 12,087,205 B2
(45) Date of Patent: Sep. 10, 2024

(54) GATE DRIVING CIRCUIT AND DISPLAY APPARATUS INCLUDING THE SAME

(71) Applicant: Samsung Display Co., LTD., Yongin-si (KR)

(72) Inventor: Sang Yong No, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/447,859

(22) Filed: Aug. 10, 2023

(65) Prior Publication Data

US 2024/0078958 A1  Mar. 7, 2024

(30) Foreign Application Priority Data

Sep. 6, 2022 (KR) .................... 10-2022-0112825

(51) Int. Cl.
*G09G 3/3225* (2016.01)
*G09G 3/20* (2006.01)

(52) U.S. Cl.
CPC ... *G09G 3/2092* (2013.01); *G09G 2300/0426* (2013.01); *G09G 2310/08* (2013.01)

(58) Field of Classification Search
CPC ......... G09G 3/2092; G09G 2300/0426; G09G 2310/08; G09G 3/3225; G09G 3/32; G09G 3/3275; G11C 19/28
USPC .................................. 327/108; 345/174, 214
See application file for complete search history.

(56) References Cited

U.S. PATENT DOCUMENTS

| | | | | |
|---|---|---|---|---|
| 2013/0181747 A1* | 7/2013 | Yoon | ...................... | G11C 19/28 327/108 |
| 2020/0349892 A1* | 11/2020 | Park | ..................... | G09G 3/3275 |
| 2020/0380911 A1* | 12/2020 | Park | ......................... | G09G 3/32 |
| 2023/0139398 A1* | 5/2023 | Kim | ........................ | G11C 19/28 345/214 |
| 2023/0214037 A1* | 7/2023 | Hwang | ................ | G09G 3/3225 345/174 |

FOREIGN PATENT DOCUMENTS

| | | |
|---|---|---|
| KR | 10-2018-0077600 A | 7/2018 |
| KR | 10-2018-0128123 A | 12/2018 |
| KR | 10-1992889 B1 | 6/2019 |
| KR | 10-2020-0029178 A | 3/2020 |
| KR | 10-2020-0135633 A | 12/2020 |
| KR | 10-2021-0086295 A | 7/2021 |

* cited by examiner

*Primary Examiner* — Abdul-Samad A Adediran
(74) *Attorney, Agent, or Firm* — Lewis Roca Rothgerber Christie LLP

(57) ABSTRACT

A gate driving circuit includes: a pull-up control circuit configured to control a voltage of a pull-up control node in response to a pull-up control signal; a pull-down control circuit configured to control a voltage of a pull-down control node in response to the voltage of the pull-up control node; a carry output circuit configured to output a carry signal in response to the voltage of the pull-up control node and the voltage of the pull-down control node; and a gate output circuit configured to output a plurality of gate signals having different timings in response to the voltage of the pull-up control node and the voltage of the pull-down control node, wherein a width of the carry signal is greater than a width of each of the gate signals.

21 Claims, 8 Drawing Sheets

GATE DRIVING CIRCUIT AND DISPLAY APPARATUS INCLUDING THE SAME

CROSS-REFERENCED TO RELATED APPLICATION

The present application claims priority to and the benefit of Korean Patent Application No. 10-2022-0112825, filed on Sep. 6, 2022, in the Korean Intellectual Property Office KIPO, the entire content of which is incorporated herein by reference.

BACKGROUND

1. Field

Aspects of some embodiments of the present inventive concept relate to a gate driving circuit and a display apparatus including the gate driving circuit.

2. Description of the Related Art

Generally, a display apparatus includes a display panel and a display panel driver. The display panel displays images based on input image data. The display panel includes a plurality of gate lines, a plurality of data lines and a plurality of pixels. The display panel driver includes a gate driver and a data driver. The gate driver outputs gate signals to the gate lines. The data driver outputs data voltages to the data lines.

When the gate driver is integrated on the display panel, a number of transistors of the gate driver and a number of signal lines may affect a dead space of the display apparatus. For example, when the number of transistors of the gate driver and the number of signal lines increases, the dead space of the display apparatus may increase.

In addition, the reliability of the gate driver may be deteriorated according to waveforms of signals applied to the transistors of the gate driver and the levels of voltages applied to the transistors of the gate driver.

The above information disclosed in this Background section is only for enhancement of understanding of the background and therefore the information discussed in this Background section does not necessarily constitute prior art.

SUMMARY

Aspects of some embodiments of the present inventive concept relate to a gate driving circuit and a display apparatus including the gate driving circuit. For example, aspects of some embodiments of the present inventive concept relate to a gate driving circuit that may be capable of removing a dead space of the display apparatus and enhancing a reliability and a display apparatus including the gate driving circuit.

Aspects of some embodiments of the present inventive concept include a gate driving circuit reducing a dead space of a display apparatus and enhancing a reliability.

Aspects of some embodiments of the present inventive concept also include a display apparatus including the gate driving circuit.

According to some embodiments of the present inventive concept, in a gate driving circuit the gate driving circuit includes a pull-up control circuit, a pull-down control circuit, a carry output circuit and a gate output circuit. According to some embodiments, the pull-up control circuit is configured to control a voltage of a pull-up control node in response to a pull-up control signal. According to some embodiments, the pull-down control circuit is configured to control a voltage of a pull-down control node in response to the voltage of the pull-up control node. According to some embodiments, the carry output circuit is configured to output a carry signal in response to the voltage of the pull-up control node and the voltage of the pull-down control node. According to some embodiments, the gate output circuit is configured to output a plurality of gate signals having different timings in response to the voltage of the pull-up control node and the voltage of the pull-down control node. According to some embodiments, a width of the carry signal is greater than a width of each of the gate signals.

According to some embodiments, the pull-up control circuit may include a fourth switching element including a control electrode configured to receive the pull-up control circuit, an input electrode configured to receive a previous carry signal which is one of carry signals of previous stages and an output electrode connected to the pull-up control node.

According to some embodiments, an active pulse may be included in an active period of the previous carry signal.

According to some embodiments, a low level of the previous carry signal may be greater than a low level of the pull-up control signal.

According to some embodiments, the fourth switching element may include two transistors connected to each other in series. According to some embodiments, the gate driving circuit may further include a tenth switching element including a control electrode connected to the pull-up control node, an input electrode configured to receive a high-power voltage and an output electrode connected to an intermediate node of the two transistors of the fourth switching element which are connected to each other in series.

According to some embodiments, the pull-down control circuit may include a seventh switching element including a control electrode connected to the pull-up control node, an input electrode configured to receive a second low power voltage and an output electrode connected to the pull-down control node and an eighth switching element including a control electrode configured to receive a next carry signal which is one of carry signals of next stages, an input electrode configured to receive a high-power voltage and an output electrode connected to the pull-down control node.

According to some embodiments, the seventh switching element may include two transistors connected to each other in series. According to some embodiments, the pull-down control circuit may further include a twelfth switching element including a control electrode connected to the pull-down control node, an input electrode configured to receive the high-power voltage and an output electrode connected to an intermediate node of the two transistors of the seventh switching element which are connected to each other in series.

According to some embodiments, the gate driving circuit may further include a fifth switching element including a control electrode configured to receive a fourth control signal, an input electrode configured to receive the high-power voltage and an output electrode connected to the pull-down control node.

According to some embodiments, the carry output circuit may include a fifteenth switching element including a control electrode connected to the pull-up control node, an input electrode configured to receive a carry clock signal and an output electrode connected to a carry output node, a seventeenth switching element including a control electrode connected to the pull-down control node, an input electrode configured to receive a second low power voltage and an output electrode connected to the carry output node and a boosting capacitor including a first end connected to the control electrode of the fifteenth switching element and a second end connected to the carry output node.

According to some embodiments, a duty ratio of the carry clock signal may be greater than 50%.

According to some embodiments, the gate output circuit may include a 1A switching element including a control electrode connected to the pull-up control node, an input electrode configured to receive a first gate clock signal and an output electrode connected to a first gate output node, a 3A switching element including a control electrode connected to the pull-down control node, an input electrode configured to receive a first low power voltage and an output electrode connected to the first gate output node, a 1B switching element including a control electrode connected to the pull-up control node, an input electrode configured to receive a second gate clock signal having a timing different from a timing of the first gate clock signal and an output electrode connected to a second gate output node and a 3B switching element including a control electrode connected to the pull-down control node, an input electrode configured to receive the first low power voltage and an output electrode connected to the second gate output node.

According to some embodiments, the gate output circuit may further include a 1C switching element including a control electrode connected to the pull-up control node, an input electrode configured to receive a third gate clock signal having a timing different from the timings of the first gate clock signal and the second gate clock signal and an output electrode connected to a third gate output node, a 3C switching element including a control electrode connected to the pull-down control node, an input electrode configured to receive the first low power voltage and an output electrode connected to the third gate output node, a 1 D switching element including a control electrode connected to the pull-up control node, an input electrode configured to receive a fourth gate clock signal having a timing different from the timings of the first gate clock signal, the second gate clock signal and the third gate clock signal and an output electrode connected to a fourth gate output node and a 3D switching element including a control electrode connected to the pull-down control node, an input electrode receiving the first low power voltage and an output electrode connected to the fourth gate output node.

According to some embodiments, a low level of gate clock signals applied to the gate output circuit may be greater than a low level of a carry clock signal applied to the carry output circuit.

According to some embodiments, the gate driving circuit may further include a ninth switching element including a control electrode configured to receive a high-power voltage, an input electrode connected to a first pull-up control node and an output electrode connected to a second pull-up control node.

According to some embodiments, the gate driving circuit may further include a line selecting circuit configured to select a gate line of a stage which has the carry signal having an active level as a sensing gate line based on a first control signal.

According to some embodiments, the line selecting circuit may include a first sensing switching element including a control electrode configured to receive the first control signal, an input electrode configured to receive the carry signal and an output electrode connected to M node, a second sensing switching element including a control electrode configured to receive a second control signal, an input electrode connected to an output electrode of a third sensing switching element and an output electrode connected to the pull-up control node, the third sensing switching element including a control electrode connected to the M node, an input electrode configured to receive a high-power voltage and the output electrode connected to the input electrode of the second sensing switching element and a first capacitor including a first end configured to receive the high-power voltage and a second end connected to the M node.

According to some embodiments, the second sensing switching element may include two transistors connected to each other in series. According to some embodiments, the gate driving circuit may further include a tenth switching element including a control electrode connected to the pull-up control node, an input electrode configured to receive the high-power voltage and an output electrode connected to an intermediate node of the two transistors of the second sensing switching element which are connected to each other in series.

According to some embodiments, the gate driving circuit may further include a line discharging circuit configured to discharge the pull-up control node corresponding to the sensing gate line based on a third control signal.

According to some embodiments, the line discharging circuit may include a fifth sensing switching element including a control electrode connected to M node, an input electrode configured to receive a second low power voltage and an output electrode connected to an input electrode of a fourth sensing switching element and the fourth sensing switching element including a control electrode configured to receive the third control signal, the input electrode connected to the output electrode of the fifth sensing switching element and an output electrode connected to the pull-up control node.

According to some embodiments, the fourth sensing switching element may include two transistors connected to each other in series. According to some embodiments, the gate driving circuit may further include a tenth switching element including a control electrode connected to the pull-up control node, an input electrode configured to receive a high-power voltage and an output electrode connected to an intermediate node of the two transistors of the fourth sensing switching element which are connected to each other in series.

According to some embodiments of a display apparatus according to the present inventive concept, the display apparatus includes a display panel, a gate driver and a data driver. According to some embodiments, the gate driver is configured to output a gate signal to the display panel. According to some embodiments, the data driver is configured to output a data voltage to the display panel. According to some embodiments, the gate driving circuit of the gate driver includes a pull-up control circuit, a pull-down control circuit, a carry output circuit and a gate output circuit. According to some embodiments, the pull-up control circuit is configured to control a voltage of a pull-up control node in response to a pull-up control signal. According to some embodiments, the pull-down control circuit is configured to control a voltage of a pull-down control node in response to the voltage of the pull-up control node. According to some embodiments, the carry output circuit is configured to output a carry signal in response to the voltage of the pull-up control node and the voltage of the pull-down control node. According to some embodiments, the gate output circuit is configured to output a plurality of the gate signals having different timings in response to the voltage of the pull-up control node and the voltage of the pull-down control node. According to some embodiments, a width of the carry signal is greater than a width of each of the gate signals.

According to the gate driving circuit and the display apparatus, a number of carry clock signals is fixed even when a number of gate clock signals increases so that a number of signal lines of the gate driving circuit may be minimized. Thus, according to some embodiments, the dead space of the display apparatus may be relatively reduced.

In addition, the gate driving circuit according to some embodiments of the present inventive concept includes fewer transistors than conventional gate driving circuits so that the dead space of the display apparatus may be reduced.

In addition, the carry signal of the previous stage is applied to the input electrode of the fourth switching element and the additional control signal is applied to the control electrode of the fourth switching element so that the reliability of the gate driving circuit may be enhanced.

In addition, the low level of the gate clock signal may be set to be greater than the low level of the carry clock signal so that the reliability of the gate pull-up switching element may be enhanced. In addition, the low level of the carry clock signal may be set to be greater than the low level of the pull-up control signal applied to the control electrode of the fourth switching element so that the reliability of the fourth switching element may be enhanced.

BRIEF DESCRIPTION OF THE DRAWINGS

The above and other features and characteristics of the present inventive concept will become more apparent by describing in more detail aspects of some embodiments thereof with reference to the accompanying drawings, in which.

DETAILED DESCRIPTION

Hereinafter, aspects of some embodiments of the present inventive concept will be explained in more detail with reference to the accompanying drawings.

Figure 1:
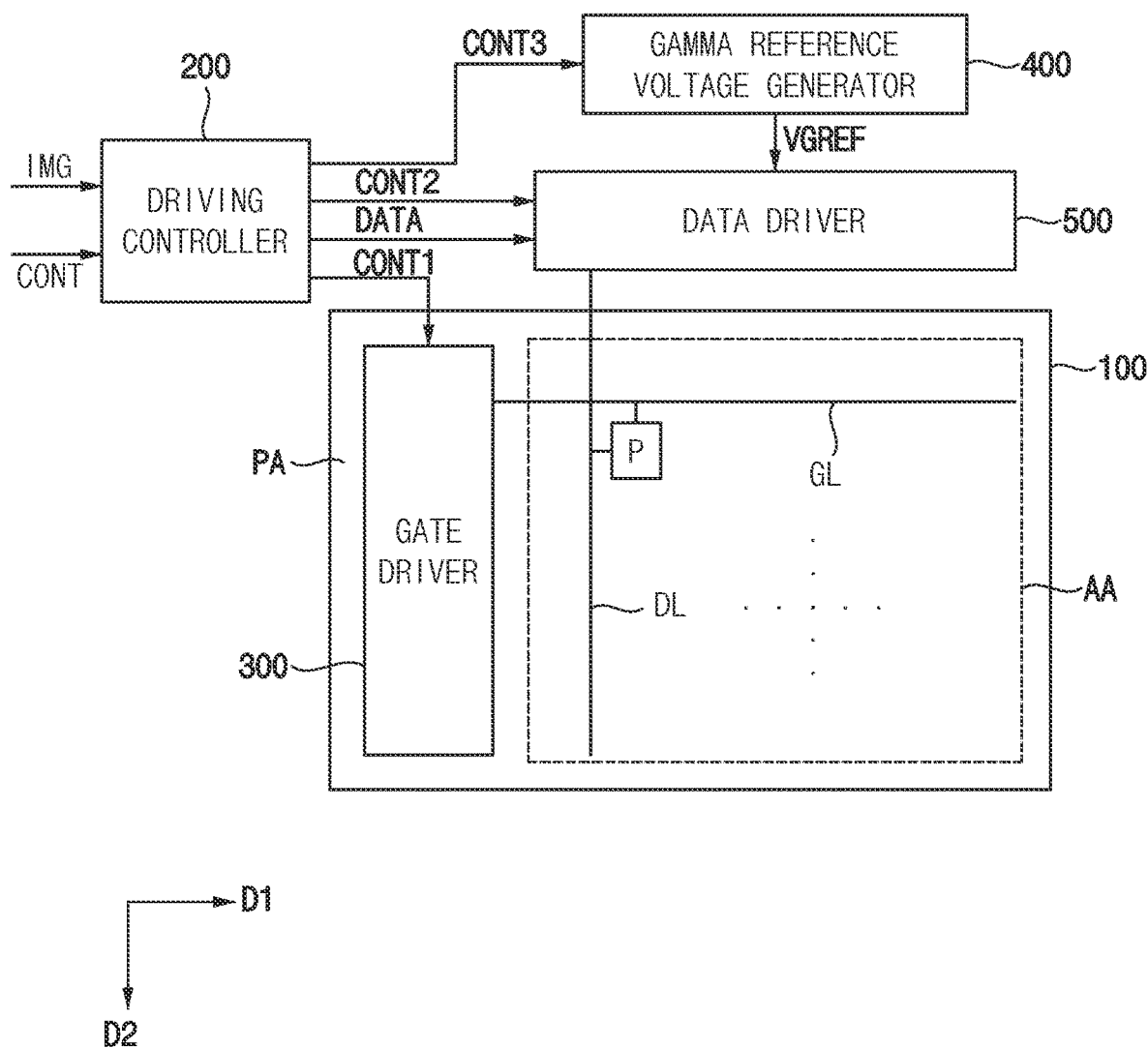
FIG. 1 is a block diagram illustrating a display apparatus according to some embodiments of the present inventive concept.

FIG. 1 is a block diagram illustrating a display apparatus according to some embodiments of the present inventive concept.

Referring to FIG. 1, the display apparatus includes a display panel 100 and a display panel driver. The display panel driver includes a driving controller 200, a gate driver 300, a gamma reference voltage generator 400, and a data driver 500.

For example, the driving controller 200 and the data driver 500 may be integrally formed. That is the driving controller 200 and the data driver 500, according to some embodiments, may be integrated into the same chip or component. Additionally, according to some embodiments, the driving controller 200, the gamma reference voltage generator 400, and the data driver 500 may be integrally formed. That is, according to some embodiments, the driving controller 200, the gamma reference voltage generator 400, and the data driver 500 may be integrated into the same chip or component. A driving module including at least the driving controller 200 and the data driver 500, which are integrally formed may be called to a timing controller embedded data driver (TED).

The display panel 100 has a display region AA at which images are displayed and a peripheral region PA adjacent to (e.g., in a periphery or outside a footprint of) the display region AA.

The display panel 100 includes a plurality of gate lines GL, a plurality of data lines DL and a plurality of pixels connected to the gate lines GL and the data lines DL. The gate lines GL may extend in a first direction D1 and the data lines DL may extend in a second direction D2 crossing the first direction D1.

The driving controller 200 receives input image data IMG and an input control signal CONT from an external apparatus. The input image data IMG may include red image data, green image data and blue image data. The input image data IMG may include white image data. The input image data IMG may include magenta image data, yellow image data and cyan image data. The input control signal CONT may include a master clock signal and a data enable signal. The input control signal CONT may further include a vertical synchronizing signal and a horizontal synchronizing signal.

The driving controller 200 generates a gate control signal CONT1, a data control signal CONT2, a gamma control signal CONT3 and a data signal DATA based on the input image data IMG and the input control signal CONT.

The driving controller 200 generates the gate control signal CONT1 for controlling an operation of the gate driver 300 based on the input control signal CONT, and outputs the gate control signal CONT1 to the gate driver 300. The gate control signal CONT1 may include a vertical start signal and a gate clock signal.

The driving controller 200 generates the data control signal CONT2 for controlling an operation of the data driver 500 based on the input control signal CONT, and outputs the data control signal CONT2 to the data driver 500. The data control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the gamma control signal CONT3 for controlling an operation of the gamma reference voltage generator 400 based on the input control signal CONT, and outputs the gamma control signal CONT3 to the gamma reference voltage generator 400.

The gate driver 300 generates gate signals driving the gate lines GL in response to the gate control signal CONT1 received from the driving controller 200. The gate driver 300 outputs the gate signals to the gate lines GL. For example, the gate driver 300 may sequentially output the gate signals to the gate lines GL. For example, the gate driver 300 may be mounted on the peripheral region of the display panel 100. For example, the gate driver 300 may be integrated on the peripheral region of the display panel 100.

The gamma reference voltage generator 400 generates a gamma reference voltage VGREF in response to the gamma control signal CONT3 received from the driving controller 200. The gamma reference voltage generator 400 provides the gamma reference voltage VGREF to the data driver 500.

According to some embodiments, the gamma reference voltage generator 400 may be located in the driving controller 200, or in the data driver 500.

The data driver 500 receives the data control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

Figure 2:
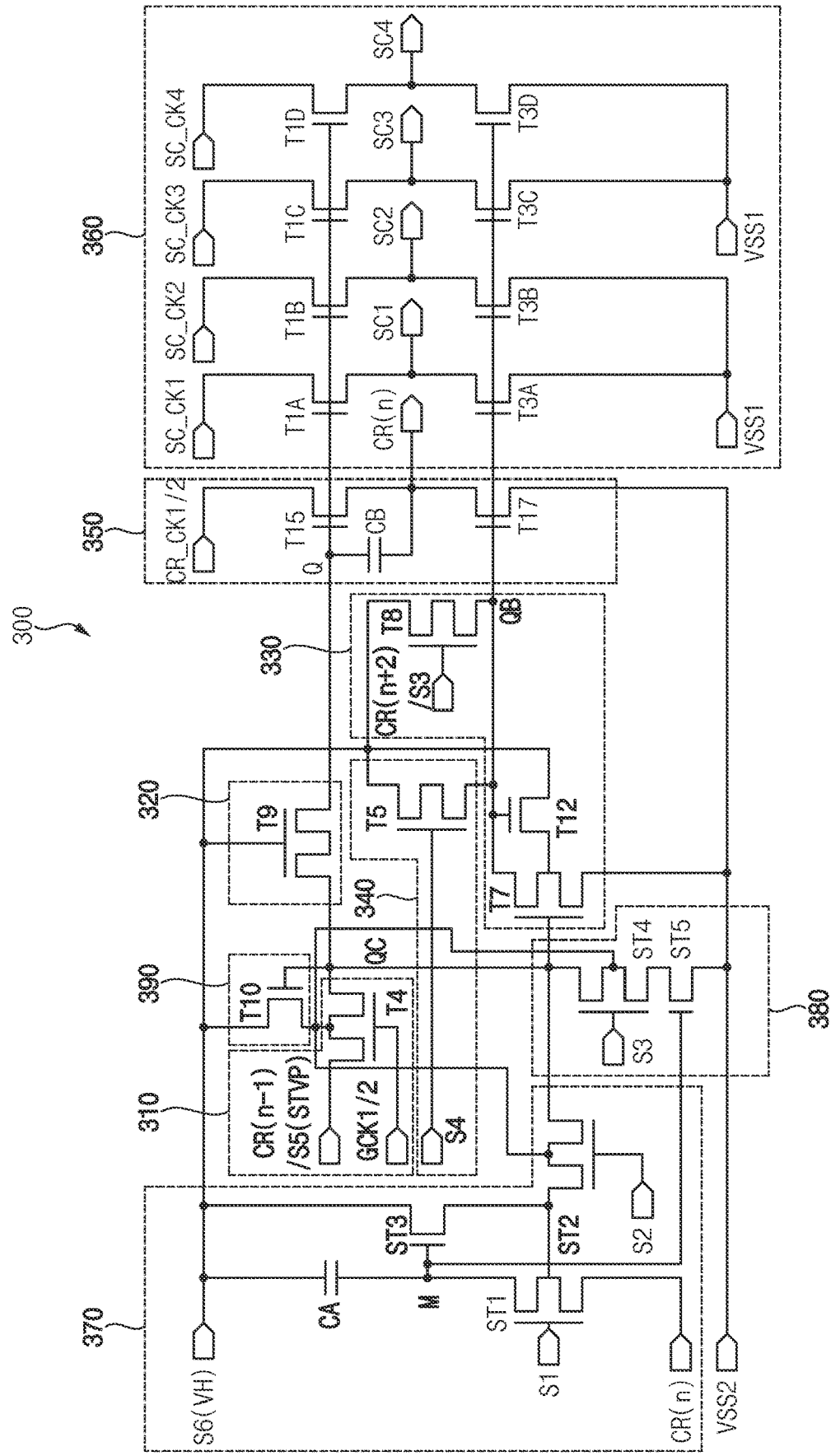
FIG. 2 is a circuit diagram illustrating a gate driving circuit of a gate driver of FIG. 1.
Figure 3:
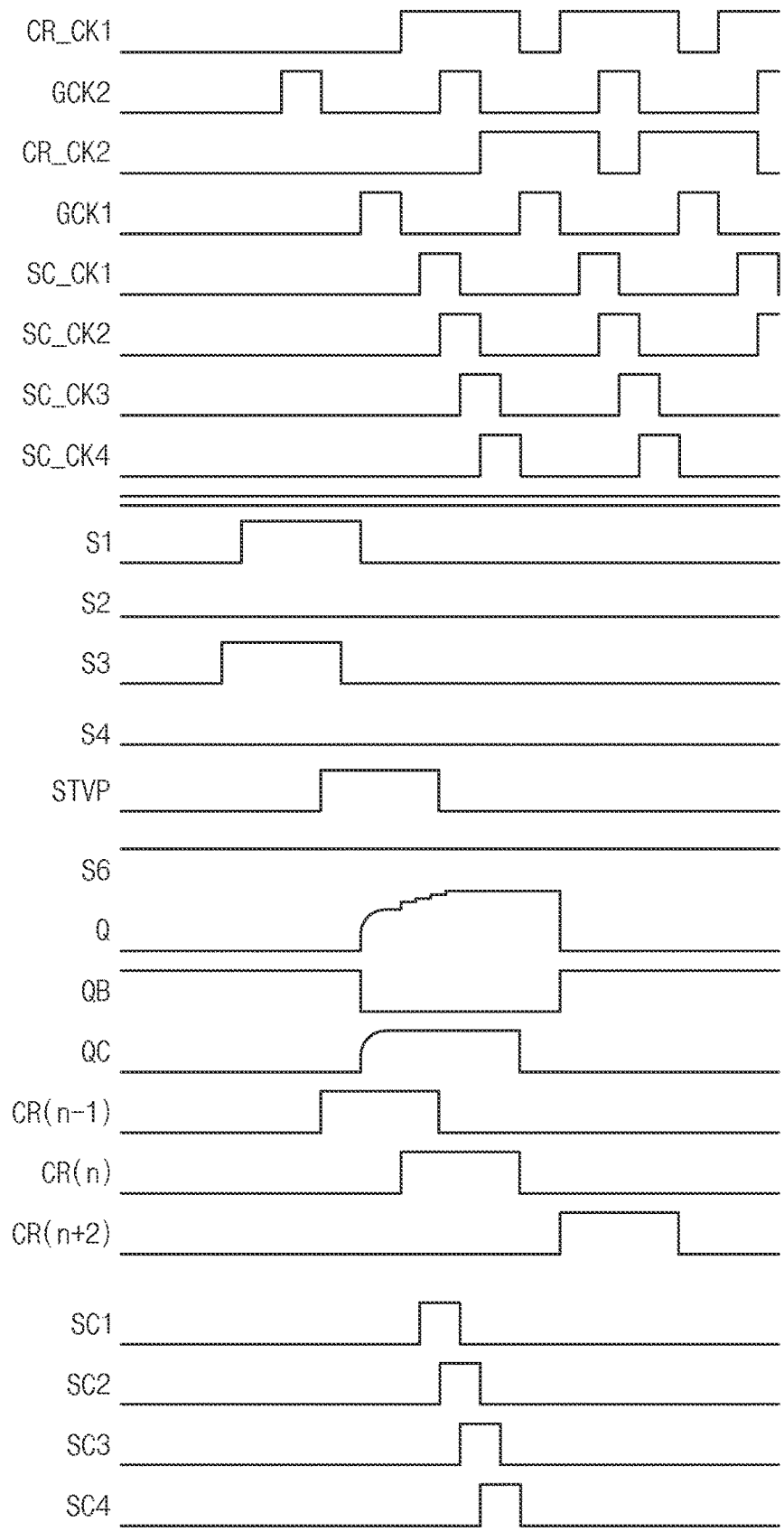
FIG. 3 is a timing diagram illustrating input signals, node signals and output signals of the gate driving circuit of FIG. 2.
Figure 4:
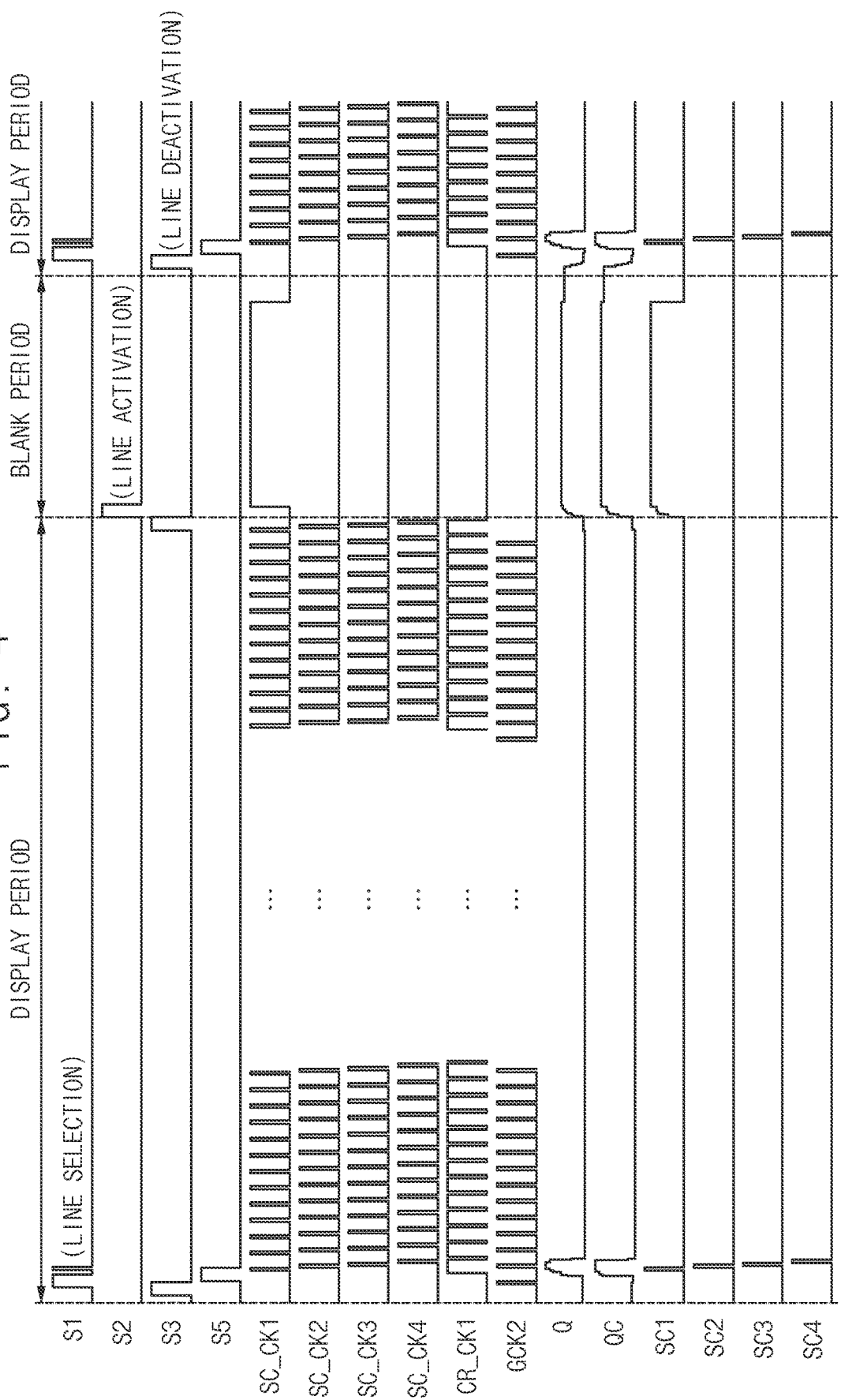
FIG. 4 is a timing diagram illustrating input signals, node signals and output signals of the gate driving circuit of FIG. 2.

FIG. 2 is a circuit diagram illustrating a gate driving circuit of the gate driver 300 of FIG. 1. FIG. 3 is a timing diagram illustrating input signals, node signals and output signals of the gate driving circuit of FIG. 2. FIG. 4 is a timing diagram illustrating input signals, node signals and output signals of the gate driving circuit of FIG. 2. FIG. is a timing diagram illustrating a first carry clock signal CR_CK1, a second carry clock signal CR_CK2, a first pull-up control signal GCK1 and a second pull-up control signal GCK2 of the gate driving circuit of FIG. 2.

Referring to FIGS. 1 to 5, the gate driving circuit includes a pull-up control circuit 310, a pull-down control circuit 330, a carry output circuit 350 and a gate output circuit 360.

The pull-up control circuit 310 may control a voltage of a pull-up control node QC or Q in response to a pull-up control circuit GCK1/GCK2.

For example, the pull-up control circuit 310 may include a fourth switching element T4 including a control electrode receiving the pull-up control circuit GCK1/GCK2, an input electrode receiving a previous carry signal CR(n−1) which is one of carry signals of previous stages and an output electrode connected to the pull-up control node QC or Q.

According to some embodiments, the previous carry signal CR(n−1) may be a carry signal of an immediately previous stage of a present stage. The previous stage does not exist for an uppermost stage so that a vertical start signal S5(STVP) may be applied to the uppermost stage instead of the previous carry signal CR(n−1).

When the pull-up control signal GCK1/GCK2 has an active level, the fourth switching element T4 is turned on so that the previous carry signal CR(n−1) may be applied to the pull-up control node QC or Q. As such, according to some embodiments, the signal applied to the control electrode of the fourth switching element T4 and the signal applied to the input electrode may be separated. The fourth switching element T4 is turned on not by the previous carry signal CR(n−1) but by the pull-up control signal GCK1/GCK2 so that an error in which adjacent gate lines simultaneously (or concurrently) output gate signals may be prevented or reduced even if activation periods of carry signals of adjacent stages overlap with each other as shown in FIG. 4.

The active pulse of the pull-up control signal (GCK1 in FIG. 4) may be included in the active period of the previous carry signal CR(n−1). When a first active pulse of GCK1 in FIG. 4 is applied to the control electrode of the fourth switching element T4, the fourth switching element T4 may be turned on so that an active level of the previous carry signal CR(n−1) may be applied to the pull-up control node QC or Q. When a second active pulse of GCK1 in FIG. 4 is applied to the control electrode of the fourth switching element T4, the fourth switching element T4 may be turned on so that an inactive level of the previous carry signal CR(n−1) may be applied to the pull-up control node QC or Q. The fourth switching element T4 performs both to charge the pull-up control node QC or Q to a high level and to discharge the pull-up control node QC or Q to a low level so that the number of transistors may be reduced compared to conventional gate driving circuits.

A low level of the previous carry signal CR(n−1) may be greater than a low level of the pull-up control signal GCK1/GCK2. When the fourth switching element T4 is turned off, a gate-source voltage VGS of the fourth switching element T4 is negative so that the reliability of the fourth switching element T4 may be enhanced even when a threshold voltage of the fourth switching element T4 shifts negatively.

For example, the fourth switching element T4 may include two transistors connected to each other in series.

The gate driving circuit may further include a stabilizing circuit 390. The stabilizing circuit 390 may include a tenth switching element T10 including a control electrode connected to the pull-up control node QC or Q, an input electrode receiving a high-power voltage S6(VH) and an output electrode connected to an intermediate node of the two transistors of the fourth switching element T4 which are connected to each other in series.

When the pull-up control node QC or Q has an active level, the tenth switching element T10 is turned on so that the intermediate node of the two transistors of the fourth switching element T4 may rise to the high-power voltage VH. The tenth switching element T10 may prevent or reduce damage to the fourth switching element T4 due to a too high drain-source voltage VDS applied to both ends of the fourth switching element T4. In addition, the tenth switching element T10 may prevent or reduce a current leakage of the fourth switching element T4.

The pull-down control circuit 330 may control a pull-down control node QB in response to the voltage of the pull-up control node QC or Q.

For example, the pull-down control circuit 330 may include a seventh switching element T7 including a control electrode connected to the pull-up control node QC or Q, an input electrode receiving a second low power voltage VSS2 and an output electrode connected to the pull-down control node QB and an eighth switching element T8 including a control electrode receiving a next carry signal CR(n+2) which is one of carry signals of next stages, an input electrode receiving the high-power voltage VH and an output electrode connected to the pull-down control node QB.

According to some embodiments, the next carry signal CR(n+2) may be a carry signal of a second next stage of the present stage. The next stage does not exist for a lowermost stage so that a third control signal S3 may be applied to the lowermost stage instead of the next carry signal CR(n+2).

When the pull-up control node QC or Q has an active level, the seventh switching element T7 is turned on so that the pull-down control node QB may fall to an inactive level (e.g. VSS2).

In addition, when the next carry signal CR(n+2) has an active level, the eighth switching element T8 is turned on so that the pull-down control node QB may rise to an active level (e.g. VH).

The seventh switching element T7 may include two transistors connected to each other in series. The pull-down control circuit 330 may further include a twelfth switching element T12 including a control electrode connected to the pull-down control node QB, an input electrode receiving the high-power voltage VH and an output electrode connected to an intermediate node of the two transistors of the seventh switching element T7 which are connected to each other in series.

When the pull-down control node QB has an active level, the twelfth switching element T12 is turned on so that the intermediate node of the two transistors of the seventh switching element T7 may rise to the high-power voltage VH. The twelfth switching element T12 may prevent or reduce damage to the seventh switching element T7 due to a too high drain-source voltage VDS applied to both ends of the seventh switching element T7. In addition, the twelfth switching element T12 may prevent or reduce a current leakage of the seventh switching element T7.

The gate driving circuit may further include a reset circuit 340. The reset circuit 340 may include fifth switching element T5 including a control electrode receiving a fourth control signal S4, an input electrode receiving the high-power voltage VH and an output electrode connected to the pull-down control node QB.

The fourth control signal S4 is a signal for resetting the pull-down control node QB of all stages of the gate driving circuit. For example, when the display apparatus operates abnormally, an activation pulse may be applied to the fourth control signal S4 to reset the pull-down control node QB of all stages of the gate driving circuit. In addition, in an initial period when the display apparatus is turned on, the activation pulse may be applied to the fourth control signal S4 to reset the pull-down control node QB of all stages of the gate driving circuit. In addition, in a cycle (e.g., a set or predetermined cycle) during an operation of the display apparatus, the activation pulse may be applied to the fourth control signal S4 to reset the pull-down control node QB of all stages of the gate driving circuit.

The carry output circuit 350 may output a carry signal CR(n) in response to the voltage of the pull-up control node QC or Q and the voltage of the pull-down control node QB.

The carry output circuit 350 may include a fifteenth switching element T15 including a control electrode connected to the pull-up control node QC or Q, an input electrode receiving a carry clock signal CR_CK1/2 and an output electrode connected to a carry output node, a seventeenth switching element T17 including a control electrode connected to the pull-down control node QB, an input electrode receiving the second low power voltage VSS2 and an output electrode connected to the carry output node and a boosting capacitor CB including a first end connected to the control electrode of the fifteenth switching element T15 and a second end connected to the carry output node.

When the voltage of the pull-up control node QC or Q has the active level, the fifteenth switching element T15 is turned on so that the carry clock signal CR_CK1/2 is outputted as the carry signal CR(n).

When the voltage of the pull-down control node QB has the active level, the seventeenth switching element T17 is turned on so that the carry signal CR(n) may be pulled down to the second low power voltage VSS2.

The gate output circuit 360 may output a plurality of gate signals SC1, SC2, SC3 and SC4 having different timings in response to the voltage of the pull-up control node QC or Q and the voltage of the pull-down control node QB.

According to some embodiments, for example, the gate output circuit 360 includes four output buffers and outputs four gate signals SC1, SC2, SC3 and SC4. However, the present inventive concept may not be limited to the number of the gate signals outputted from one gate output circuit 360.

For example, the gate output circuit 360 may include a 1A switching element T1A including a control electrode connected to the pull-up control node QC or Q, an input electrode receiving a first gate clock signal SC_CK1 and an output electrode connected to a first gate output node, a 3A switching element T3A including a control electrode connected to the pull-down control node QB, an input electrode receiving a first low power voltage VSS1 and an output electrode connected to the first gate output node, a 1 B switching element T1B including a control electrode connected to the pull-up control node QC or Q, an input electrode receiving a second gate clock signal SC_CK2 having a timing different from a timing of the first gate clock signal SC_CK1 and an output electrode connected to a second gate output node and a 3B switching element T3B including a control electrode connected to the pull-down control node QB, an input electrode receiving the first low power voltage VSS1 and an output electrode connected to the second gate output node.

For example, the gate output circuit 360 may further include a 1 C switching element T1C including a control electrode connected to the pull-up control node QC or Q, an input electrode receiving a third gate clock signal SC_CK3 having a timing different from the timings of the first gate clock signal SC_CK1 and the second gate clock signal SC_CK2 and an output electrode connected to a third gate output node, a 3C switching element T3C including a control electrode connected to the pull-down control node QB, an input electrode receiving the first low power voltage VSS1 and an output electrode connected to the third gate output node, a 1 D switching element T1D including a control electrode connected to the pull-up control node QC or Q, an input electrode receiving a fourth gate clock signal SC_CK4 having a timing different from the timings of the first gate clock signal SC_CK1, the second gate clock signal SC_CK2 and the third gate clock signal SC_CK3 and an output electrode connected to a fourth gate output node and a 3D switching element T3D including a control electrode connected to the pull-down control node QB, an input electrode receiving the first low power voltage VSS1 and an output electrode connected to the fourth gate output node.

When the voltage of the pull-up control node QC or Q has the active level, the 1A switching element T1A is turned on so that the first gate clock signal SC_CK1 is outputted as the first gate signal SC1.

When the voltage of the pull-down control node QB has the active level, the 3A switching element T3A is turned on so that the first gate signal SC1 may be pulled down to the first low power voltage VSS1.

When the voltage of the pull-up control node QC or Q has the active level, the 1B switching element T1B is turned on so that the second gate clock signal SC_CK2 is outputted as the second gate signal SC2.

When the voltage of the pull-down control node QB has the active level, the 3B switching element T3B is turned on so that the second gate signal SC2 may be pulled down to the first low power voltage VSS1.

When the voltage of the pull-up control node QC or Q has the active level, the 1C switching element T1C is turned on so that the third gate clock signal SC_CK3 is outputted as the third gate signal SC3.

When the voltage of the pull-down control node QB has the active level, the 3C switching element T3C is turned on so that the third gate signal SC3 may be pulled down to the first low power voltage VSS1.

When the voltage of the pull-up control node QC or Q has the active level, the 1D switching element T1D is turned on so that the fourth gate clock signal SC_CK4 is outputted as the fourth gate signal SC4.

When the voltage of the pull-down control node QB has the active level, the 3D switching element T3D is turned on so that the fourth gate signal SC4 may be pulled down to the first low power voltage VSS1.

As shown in FIG. 3, the first to fourth gate clock signals SC_CK1, SC_CK2, SC_CK3 and SC_CK4 may have different timings and the first to fourth gate signals SC1, SC2, SC3 and SC4 may have different timings.

For example, the first to fourth gate signals SC1, SC2, SC3 and SC4 may be sequentially applied to adjacent four gate lines. A first stage of the gate driving circuit may output the first to fourth gate signals SC1, SC2, SC3 and SC4 to first to fourth gate lines. A second stage of the gate driving circuit may output fifth to eighth gate signals to fifth to eighth gate lines.

According to some embodiments, the gate output circuit 360 of the gate driving circuit may output four gate signals and herein, the gate clock signals may have eight different phases. In FIG. 3, the first to fourth gate clock signals SC_CK1, SC_CK2, SC_CK3 and SC_CK4 for outputting the first to fourth gate signals SC1, SC2, SC3 and SC4 are shown and the fifth to eighth gate clock signals for outputting the fifth to eighth gate signals are omitted.

According to some embodiments, for example, a number of the carry clock signal may be two (e.g. CR_CK1 and CR_CK2). According to some embodiments, the number of the carry clock signals may be fixed to two regardless of the number of the gate signals outputted from one stage of the gate driving circuit. Thus, according to some embodiments, the dead space of the display apparatus may be reduced by reducing the number of the carry clock signals CR_CK1 and CR_CK2.

According to some embodiments, a width of the carry signal CR(n) may be greater than a width of each of the gate signals SC1, SC2, SC3 and SC4. In FIG. 3, all active pulses of four gate signals SC1, SC2, SC3 and SC4 outputted from the present stage may be included in an active period of the carry signal CR(n) of the present stage.

According to some embodiments, a duty ratio of the carry clock signal CR_CK1 and CR_CK2 may be greater than 50%. The width of the carry signal CR(n) may be determined by the duty ratio of the carry clock signal CR_CK1 and CR_CK2.

According to some embodiments, the gate output circuit 360 may output the plural gate signals SC1, SC2, SC3 and SC4. To output the plural gate signals SC1, SC2, SC3 and SC4 from one stage, a width of the active period of the voltage of the pull-up control node QC or Q may be set greatly. To set the width of the active period of the voltage of the pull-up control node QC or Q greatly, the duty ratio of the carry clock signal CR_CK1 and CR_CK2 may be set greatly.

A low level of the gate clock signal SC_CK1, SC_CK2, SC_CK3 and SC_CK4 applied to the gate output circuit 360 may be greater than a low level of the carry clock signal CR_CK1 and CR_CK2 applied to the carry output circuit 350. The low level of the voltage of the pull-up control node QC or Q may be determined by the low level of the carry clock signal CR_CK1 and CR_CK2. Thus, when the low level of the carry clock signal CR_CK1 and CR_CK2 is less than the low level of the gate clock signal SC_CK1, SC_CK2, SC_CK3 and SC_CK4, a gate-source voltage VGS of the 1A switching element T1A, a gate-source voltage VGS of the 1B switching element T1B, a gate-source voltage VGS of the 1C switching element T1C and a gate-source voltage VGS of the 1D switching element T1D are respectively negative so that the reliability of the 1A switching element T1A, the 1B switching element T1B, the 1C switching element T1C and the 1D switching element T1D may be enhanced even when threshold voltages of the 1A switching element T1A, the 1B switching element T1B, the 1C switching element T1C and the 1D switching element T1D shift negatively.

The gate driving circuit may further include a node separating circuit 320 located between the pull-up control circuit 310 and the carry output circuit 350.

The node separating circuit 320 may include a ninth switching element T9 including a control electrode receiving the high-power voltage VH, an input electrode connected to a first pull-up control node QC and an output electrode connected to a second pull-up control node Q. According to some embodiments, the first pull-up control node QC and the second pull-up control node Q may be separated by the ninth switching element T9.

As shown in FIG. 3, when the first gate voltage SC1, the second gate voltage SC2, the third gate voltage SC3 and the fourth gate voltage SC4 are outputted, a level of the voltage of the second pull-up control node Q may fluctuate. In contrast, the first pull-up control node QC and the second pull-up control node Q are separated by the ninth switching element T9 (e.g., the ninth switching element T9 turning off) so that the level of the voltage of the first pull-up control node QC may not fluctuate even when the first gate voltage SC1, the second gate voltage SC2, the third gate voltage SC3 and the fourth gate voltage SC4 are outputted.

In addition, when the second pull-up node Q is bootstrapped, the first pull-up node QC may not be bootstrapped by the ninth switching element T9. A high level of the first pull-up control node QC may be maintained lower than a high level of the second pull-up control node Q so that a drain-source voltage VDS of the fourth switching element T4 may be reduced and the damage and the current leakage of the fourth switching element T4 may be prevented or reduced.

The gate driving circuit may further include a line selecting circuit 370 selecting a gate line of the stage which has the carry signal CR(n) having the active level as a sensing gate line based on a first control signal S1.

The line selecting circuit 370 may include a first sensing switching element ST1 including a control electrode receiving the first control signal S1, an input electrode receiving the carry signal CR(n) and an output electrode connected to M node, a second sensing switching element ST2 including a control electrode receiving a second control signal S2, an input electrode connected to an output electrode of a third sensing switching element ST3 and an output electrode connected to the pull-up control node QC or Q, the third sensing switching element ST3 including a control electrode connected to the M node, an input electrode receiving the high-power voltage VH and the output electrode connected to the input electrode of the second sensing switching element ST2 and a first capacitor CA including a first end receiving the high-power voltage VH and a second end connected to the M node.

For example, the second sensing switching element ST2 may include two transistors connected to each other in series. The output electrode of the tenth switching element T10 of the stabilizing circuit 390 may be connected to an intermediate node of the two transistors of the second sensing switching element ST2 which are connected to each other in series.

When the pull-up control node QC or Q has the active level, the tenth switching element T10 is turned on so that the intermediate node of the two transistors of the second sensing switching element ST2 may rise to the high-power voltage VH. The tenth switching element T10 may prevent or reduce damage to the second sensing switching element ST2 due to a too high drain-source voltage VDS applied to both ends of the second sensing switching element ST2. In addition, the tenth switching element T10 may prevent or reduce a current leakage of the second sensing switching element ST2.

The gate driving circuit may further include a line discharging circuit 380 discharging the pull-up control node QC or Q corresponding to the sensing gate line based on a third control signal S3. The line discharging circuit 380 may selectively discharge the pull-up control node QC or Q of the stage selectively charged by the line selecting circuit 370.

The line discharging circuit 380 may include a fifth sensing switching element ST5 including a control electrode connected to the M node, an input electrode receiving the second low power voltage VSS2 and an output electrode connected to an input electrode of a fourth sensing switching element ST4 and the fourth sensing switching element ST4 including a control electrode receiving the third control signal S3, the input electrode connected to the output electrode of the fifth sensing switching element ST5 and an output electrode connected to the pull-up control node QC or Q.

For example, the fourth sensing switching element ST4 may include two transistors connected to each other in series. The output electrode of the tenth switching element T10 of the stabilizing circuit 390 may be connected to an intermediate node of the two transistors of the fourth sensing switching element ST4 which are connected to each other in series.

When the pull-up control node QC or Q has the active level, the tenth switching element T10 is turned on so that the intermediate node of the two transistors of the fourth sensing switching element ST4 may rise to the high-power voltage VH. The tenth switching element T10 may prevent or reduce damage to the fourth sensing switching element ST4 due to a too high drain-source voltage VDS applied to both ends of the fourth sensing switching element ST4. In addition, the tenth switching element T10 may prevent or reduce a current leakage of the fourth sensing switching element ST4.

In FIG. 4, a first active pulse of the first control signal S1 may indicate the initialization and a second active pulse of the first control signal S1 may indicate the line selection operation.

When the first control signal S1 has the active pulse, the first sensing switching element ST1 is turned on and the gate line of the stage which has the carry signal CR(n) having the active level is selected as the sensing gate line.

FIG. 4 illustrates a case in which a first gate lines is selected as the sensing gate line when the second pulse of the first control signal S1 is activated.

The first gate line selected as the sensing gate line may be activated by the second control signal S2 in at a start of a blank period and the first gate clock signal SC_CK1 may have a high level and the first gate line may output a sensing gate signal SC1.

When the third control signal S3 has an active level at a start of a next display period, the pull-up control node (QC or Q) of the stage where the M node was activated may be discharged by the fourth sensing switching element ST4 and the fifth sensing switching element ST5 so that the selected first gate line may not be the sensing gate line anymore.

Figure 5:
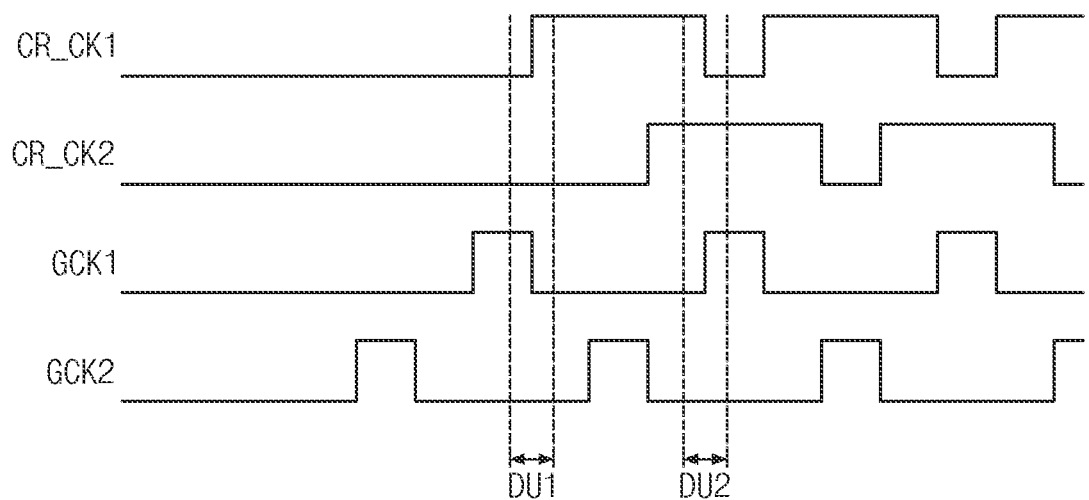
FIG. 5 is a timing diagram illustrating a first carry clock signal, a second carry clock signal, a first pull-up control signal and a second pull-up control signal of the gate driving circuit of FIG. 2.

As shown in a first period DU1 of FIG. 5, an activation period of the first pull-up control signal GCK1 and an active period of the first carry clock signal CR_CK1 may not overlap each other. When the activation period of the first pull-up control signal GCK1 and the active period of the first carry clock signal CR_CK1 overlap each other in the first period DU1, the first carry clock signal CR_CK1 may have a high level in a state in which the fourth switching element T4 is not turned off. In this case, the voltage of the pull-up control node QC or Q may be discharged by the turned-on fourth switching element T4 so that the reliability of the gate driving circuit may be deteriorated.

As shown in a second period DU2 of FIG. 5, an activation period of the first pull-up control signal GCK1 and an active period of the first carry clock signal CR_CK1 may not overlap each other. When the activation period of the first pull-up control signal GCK1 and the active period of the first carry clock signal CR_CK1 overlap each other in the second period DU2, the fourth switching element T4 may be turned on in a state in which the first carry clock signal CR_CK1 has the high level. In this case, while the last scan signal (e.g. SC4) is being output, the voltage of the pull-up control node QC or Q may be discharged and the last scan signal (e.g. SC4) may not normally pulled down so that the reliability of the gate driving circuit may be deteriorated.

According to some embodiments, a number of the carry clock signals CR_CK1 and CR_CK2 is fixed even when a number of the gate clock signals SC_CK1, SC_CK2, SC_CK3 and SC_CK4 increases so that a number of signal lines of the gate driving circuit may be minimized. Thus, the dead space of the display apparatus may be reduced.

In addition, the gate driving circuit according to the present inventive concept includes fewer transistors than conventional gate driving circuits so that the dead space of the display apparatus may be reduced.

In addition, the carry signal CR(n−1) of the previous stage is applied to the input electrode of the fourth switching element T4 and the additional control signal GCK1/GCK2 is applied to the control electrode of the fourth switching element T4 so that the reliability of the gate driving circuit may be enhanced.

In addition, the low level of the gate clock signal SC_CK1, SC_CK2, SC_CK3 and SC_CK4 may be set to be greater than the low level of the carry clock signal CR_CK1 and CR_CK2 so that the reliability of the gate pull-up switching element T1A, T1B, T1C and T1D may be enhanced. The low level of the carry clock signal CR_CK1 and CR_CK2 may define the low level of the voltage of the pull-up control node QC or Q. When the low level of the gate clock signal SC_CK1, SC_CK2, SC_CK3 and SC_CK4 is greater than the low level of the carry clock signal CR_CK1 and CR_CK2, the gate-source voltages VGS of the 1A switching element T1A, the 1B switching element T1B, the 1C switching element T1C and the 1D switching element T1D may be negative respectively in turned-off states of the 1A switching element T1A, the 1B switching element T1B, the 1C switching element T1C and the 1D switching element T1D. When the gate-source voltages VGS of the 1A switching element T1A, the 1B switching element T1B, the 1C switching element T1C and the 1D switching element T1D are negative in the turned-off states of the 1A switching element T1A, the 1B switching element T1B, the 1C switching element T1C and the 1D switching element T1D, the turned-off states of the 1A switching element T1A, the 1B switching element T1B, the 1C switching element T1C and the 1D switching element T1D may be stably maintained. Particularly, the turned-off states of the 1A switching element T1A, the 1B switching element T1B, the 1C switching element T1C and the 1D switching element T1D may be stably maintained even when the threshold voltages of the 1A switching element T1A, the 1B switching element T1B, the 1C switching element T1C and the 1D switching element T1D shift negatively. Thus, the reliability of the 1A switching element T1A, the 1B switching element T1B, the 1C switching element T1C and the 1D switching element T1D may be enhanced.

In addition, the low level of the carry clock signal CR_CK1 and CR_CK2 may be set to be greater than the low level of the pull-up control signal GCK1/GCK2 applied to the control electrode of the fourth switching element T4 so that the reliability of the fourth switching element may be enhanced. The low level of the carry clock signal CR_CK1 and CR_CK2 may define the low level of the previous carry signal CR(n-1). When the low level of the previous carry signal CR(n-1) is greater than the pull-up control signal GCK1/GCK2, the gate-source voltages VGS of the fourth switching element T4 may be negative in turned-off state of the fourth switching element T4. When the gate-source voltages VGS of the fourth switching element T4 is negative in the turned-off state of the fourth switching element T4, the turned-off state of the fourth switching element T4 may be stably maintained. Particularly, the turned-off state of the fourth switching element T4 may be stably maintained even when the threshold voltage of the fourth switching element T4 shifts negatively. Thus, the reliability of the fourth switching element T4 may be enhanced.

Figure 6:
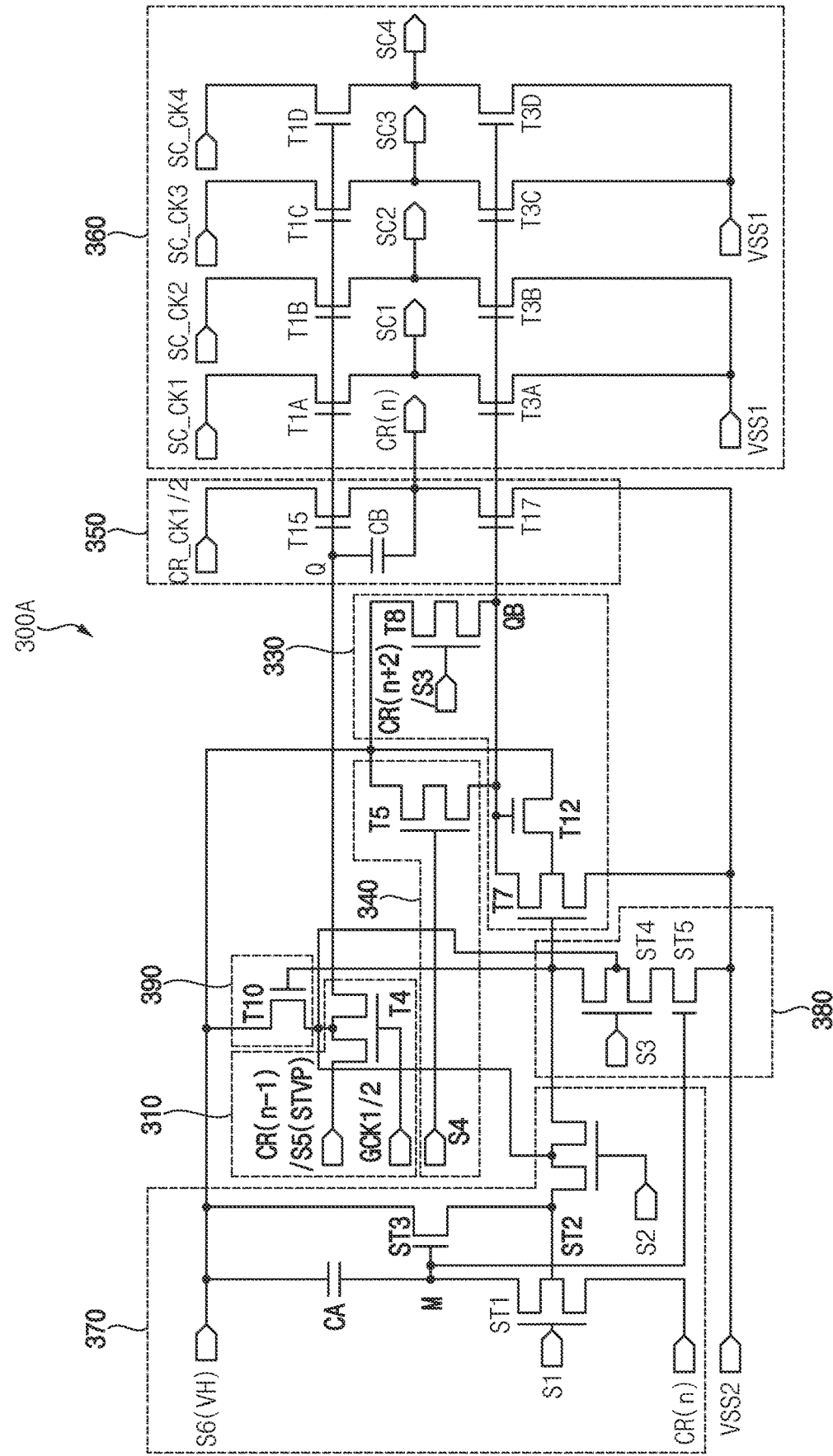
FIG. 6 is a circuit diagram illustrating a gate driving circuit of a gate driver of a display apparatus according to some embodiments of the present inventive concept.

FIG. 6 is a circuit diagram illustrating a gate driving circuit of a gate driver 300A of a display apparatus according to some embodiments of the present inventive concept.

The gate driver and the display apparatus according to some embodiments is substantially the same as the gate driver and the display apparatus of the previous embodiments explained referring to FIGS. 1 to 5 except that the gate driving circuit does not include the node separating circuit of FIG. 2. Thus, the same reference numerals will be used to refer to the same or like parts as those described in the previous embodiments of FIGS. 1 to 5 and any repetitive explanation concerning the above elements will be omitted.

Referring to FIGS. 1 and 3 to 6, the gate driving circuit includes a pull-up control circuit 310, a pull-down control circuit 330, a carry output circuit 350 and a gate output circuit 360.

The pull-up control circuit 310 may control a voltage of a pull-up control node Q in response to a pull-up control circuit GCK1/GCK2. The pull-down control circuit 330 may control a pull-down control node QB in response to the voltage of the pull-up control node Q. The carry output circuit 350 may output a carry signal CR(n) in response to the voltage of the pull-up control node Q and the voltage of the pull-down control node QB. The gate output circuit 360 may output a plurality of gate signals SC1, SC2, SC3 and SC4 having different timings in response to the voltage of the pull-up control node Q and the voltage of the pull-down control node QB.

As shown in FIG. 3, the first to fourth gate clock signals SC_CK1, SC_CK2, SC_CK3 and SC_CK4 may have different timings and the first to fourth gate signals SC1, SC2, SC3 and SC4 may have different timings.

According to some embodiments, a width of the carry signal CR(n) may be greater than a width of each of the gate signals SC1, SC2, SC3 and SC4.

According to some embodiments, the gate driving circuit does not include the node separating circuit 320 of FIG. 2 so that the output electrode of the fourth switching element T4 may be connected to the control electrodes of the fifth switching element T15, the 1A switching element T1A, the 1B switching element T1B, the 1C switching element T1C and the 1D switching element T1D.

According to some embodiments, a number of the carry clock signals CR_CK1 and CR_CK2 is fixed even when a number of the gate clock signals SC_CK1, SC_CK2, SC_CK3 and SC_CK4 increases so that a number of signal lines of the gate driving circuit may be minimized. Thus, the dead space of the display apparatus may be reduced.

In addition, the gate driving circuit according to the present inventive concept includes fewer transistors than conventional gate driving circuits so that the dead space of the display apparatus may be reduced.

In addition, the carry signal CR(n-1) of the previous stage is applied to the input electrode of the fourth switching element T4 and the additional control signal GCK1/GCK2 is applied to the control electrode of the fourth switching element T4 so that the reliability of the gate driving circuit may be enhanced.

In addition, the low level of the gate clock signal SC_CK1, SC_CK2, SC_CK3 and SC_CK4 may be set to be greater than the low level of the carry clock signal CR_CK1 and CR_CK2 so that the reliability of the gate pull-up switching element T1A, T1B, T1C and T1D may be enhanced. The low level of the carry clock signal CR_CK1 and CR_CK2 may define the low level of the voltage of the pull-up control node Q. When the low level of the gate clock signal SC_CK1, SC_CK2, SC_CK3 and SC_CK4 is greater than the low level of the carry clock signal CR_CK1 and CR_CK2, the gate-source voltages VGS of the 1A switching element T1A, the 1B switching element T1B, the 1C switching element T1C and the 1D switching element T1D may be negative respectively in turned-off states of the 1A switching element T1A, the 1B switching element T1B, the 1C switching element T1C and the 1D switching element T1D. When the gate-source voltages VGS of the 1A switching element T1A, the 1B switching element T1B, the 1C switching element T1C and the 1D switching element T1D are negative in the turned-off states of the 1A switching element T1A, the 1B switching element T1B, the 1C switching element T1C and the 1D switching element T1D, the turned-off states of the 1A switching element T1A, the 1B switching element T1B, the 1C switching element T1C and the 1D switching element T1D may be stably maintained. Particularly, the turned-off states of the 1A switching element T1A, the 1B switching element T1B, the 1C switching element T1C and the 1D switching element T1D may be stably maintained even when the threshold voltages of the 1A switching element T1A, the 1B switching element T1B, the 1C switching element T1C and the 1D switching element T1D shift negatively. Thus, the reliability of the 1A switching element T1A, the 1B switching element T1B, the 1C switching element T1C and the 1D switching element T1D may be enhanced.

In addition, the low level of the carry clock signal CR_CK1 and CR_CK2 may be set to be greater than the low level of the pull-up control signal GCK1/GCK2 applied to the control electrode of the fourth switching element T4 so that the reliability of the fourth switching element may be enhanced. The low level of the carry clock signal CR_CK1 and CR_CK2 may define the low level of the previous carry signal CR(n−1). When the low level of the previous carry signal CR(n−1) is greater than the pull-up control signal GCK1/GCK2, the gate-source voltages VGS of the fourth switching element T4 may be negative in turned-off state of the fourth switching element T4. When the gate-source voltages VGS of the fourth switching element T4 is negative in the turned-off state of the fourth switching element T4, the turned-off state of the fourth switching element T4 may be stably maintained. Particularly, the turned-off state of the fourth switching element T4 may be stably maintained even when the threshold voltage of the fourth switching element T4 shifts negatively. Thus, the reliability of the fourth switching element T4 may be enhanced.

Figure 7:
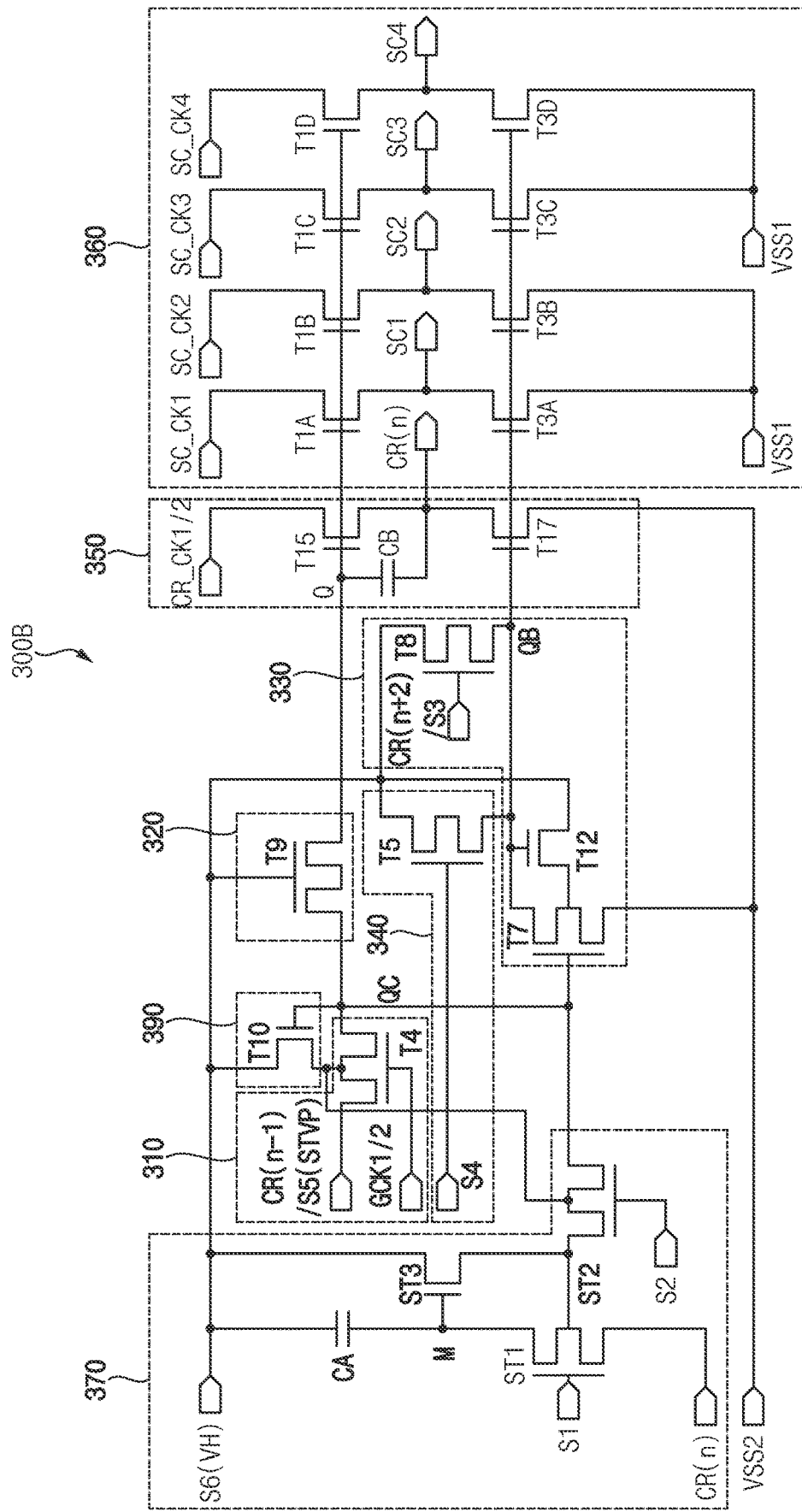
FIG. 7 is a circuit diagram illustrating a gate driving circuit of a gate driver of a display apparatus according to some embodiments of the present inventive concept.

FIG. 7 is a circuit diagram illustrating a gate driving circuit of a gate driver 300B of a display apparatus according to some embodiments of the present inventive concept.

The gate driver and the display apparatus according to the present embodiments is substantially the same as the gate driver and the display apparatus of the previous embodiments explained referring to FIGS. 1 to 5 except that the gate driving circuit does not include the line discharging circuit of FIG. 2. Thus, the same reference numerals will be used to refer to the same or like parts as those described in the previous embodiments of FIGS. 1 to 5 and some repetitive explanation concerning the above elements may be omitted.

Referring to FIGS. 1, 3 to 5 and 7, the gate driving circuit includes a pull-up control circuit 310, a pull-down control circuit 330, a carry output circuit 350 and a gate output circuit 360.

The pull-up control circuit 310 may control a voltage of a pull-up control node QC or Q in response to a pull-up control circuit GCK1/GCK2. The pull-down control circuit 330 may control a pull-down control node QB in response to the voltage of the pull-up control node QC or Q. The carry output circuit 350 may output a carry signal CR(n) in response to the voltage of the pull-up control node QC or Q and the voltage of the pull-down control node QB. The gate output circuit 360 may output a plurality of gate signals SC1, SC2, SC3 and SC4 having different timings in response to the voltage of the pull-up control node QC or Q and the voltage of the pull-down control node QB.

As shown in FIG. 3, the first to fourth gate clock signals SC_CK1, SC_CK2, SC_CK3 and SC_CK4 may have different timings and the first to fourth gate signals SC1, SC2, SC3 and SC4 may have different timings.

According to some embodiments, a width of the carry signal CR(n) may be greater than a width of each of the gate signals SC1, SC2, SC3 and SC4.

According to some embodiments, the gate driving circuit may further include a line selecting circuit 370 selecting a gate line of the stage which has the carry signal CR(n) having the active level as a sensing gate line based on a first control signal S1. However, the gate driving circuit may not include the line discharging circuit 380 of FIG. 2 which selectively discharges the pull-up control node QC or Q.

According to some embodiments, a number of the carry clock signals CR_CK1 and CR_CK2 is fixed even when a number of the gate clock signals SC_CK1, SC_CK2, SC_CK3 and SC_CK4 increases so that a number of signal lines of the gate driving circuit may be minimized. Thus, the dead space of the display apparatus may be reduced.

In addition, the gate driving circuit according to the present inventive concept includes fewer transistors than conventional gate driving circuits so that the dead space of the display apparatus may be reduced.

In addition, the carry signal CR(n−1) of the previous stage is applied to the input electrode of the fourth switching element T4 and the additional control signal GCK1/GCK2 is applied to the control electrode of the fourth switching element T4 so that the reliability of the gate driving circuit may be enhanced.

In addition, the low level of the gate clock signal SC_CK1, SC_CK2, SC_CK3 and SC_CK4 may be set to be greater than the low level of the carry clock signal CR_CK1 and CR_CK2 so that the reliability of the gate pull-up switching element T1A, T1B, T1C and T1D may be enhanced. The low level of the carry clock signal CR_CK1 and CR_CK2 may define the low level of the voltage of the pull-up control node QC or Q. When the low level of the gate clock signal SC_CK1, SC_CK2, SC_CK3 and SC_CK4 is greater than the low level of the carry clock signal CR_CK1 and CR_CK2, the gate-source voltages VGS of the 1A switching element T1A, the 1B switching element T1B, the 1C switching element T1C and the 1D switching element T1D may be negative respectively in turned-off states of the 1A switching element T1A, the 1B switching element T1B, the 1C switching element T1C and the 1D switching element T1D. When the gate-source voltages VGS of the 1A switching element T1A, the 1B switching element T1B, the 1C switching element T1C and the 1D switching element T1D are negative in the turned-off states of the 1A switching element T1A, the 1B switching element T1B, the 1C switching element T1C and the 1D switching element T1D, the turned-off states of the 1A switching element T1A, the 1B switching element T1B, the 1C switching element T1C and the 1D switching element T1D may be stably maintained. Particularly, the turned-off states of the 1A switching element T1A, the 1B switching element T1B, the 1C switching element T1C and the 1D switching element T1D may be stably maintained even when the threshold voltages of the 1A switching element T1A, the 1B switching element T1B, the 1C switching element T1C and the 1D switching element T1D shift negatively. Thus, the reliability of the 1A switching element T1A, the 1B switching element T1B, the 1C switching element T1C and the 1D switching element T1D may be enhanced.

In addition, the low level of the carry clock signal CR_CK1 and CR_CK2 may be set to be greater than the low level of the pull-up control signal GCK1/GCK2 applied to the control electrode of the fourth switching element T4 so that the reliability of the fourth switching element may be enhanced. The low level of the carry clock signal CR_CK1 and CR_CK2 may define the low level of the previous carry signal CR(n−1). When the low level of the previous carry signal CR(n−1) is greater than the pull-up control signal GCK1/GCK2, the gate-source voltages VGS of the fourth switching element T4 may be negative in turned-off state of the fourth switching element T4. When the gate-source voltages VGS of the fourth switching element T4 is negative in the turned-off state of the fourth switching element T4, the turned-off state of the fourth switching element T4 may be stably maintained. Particularly, the turned-off state of the fourth switching element T4 may be stably maintained even when the threshold voltage of the fourth switching element T4 shifts negatively. Thus, the reliability of the fourth switching element T4 may be enhanced.

Figure 8:
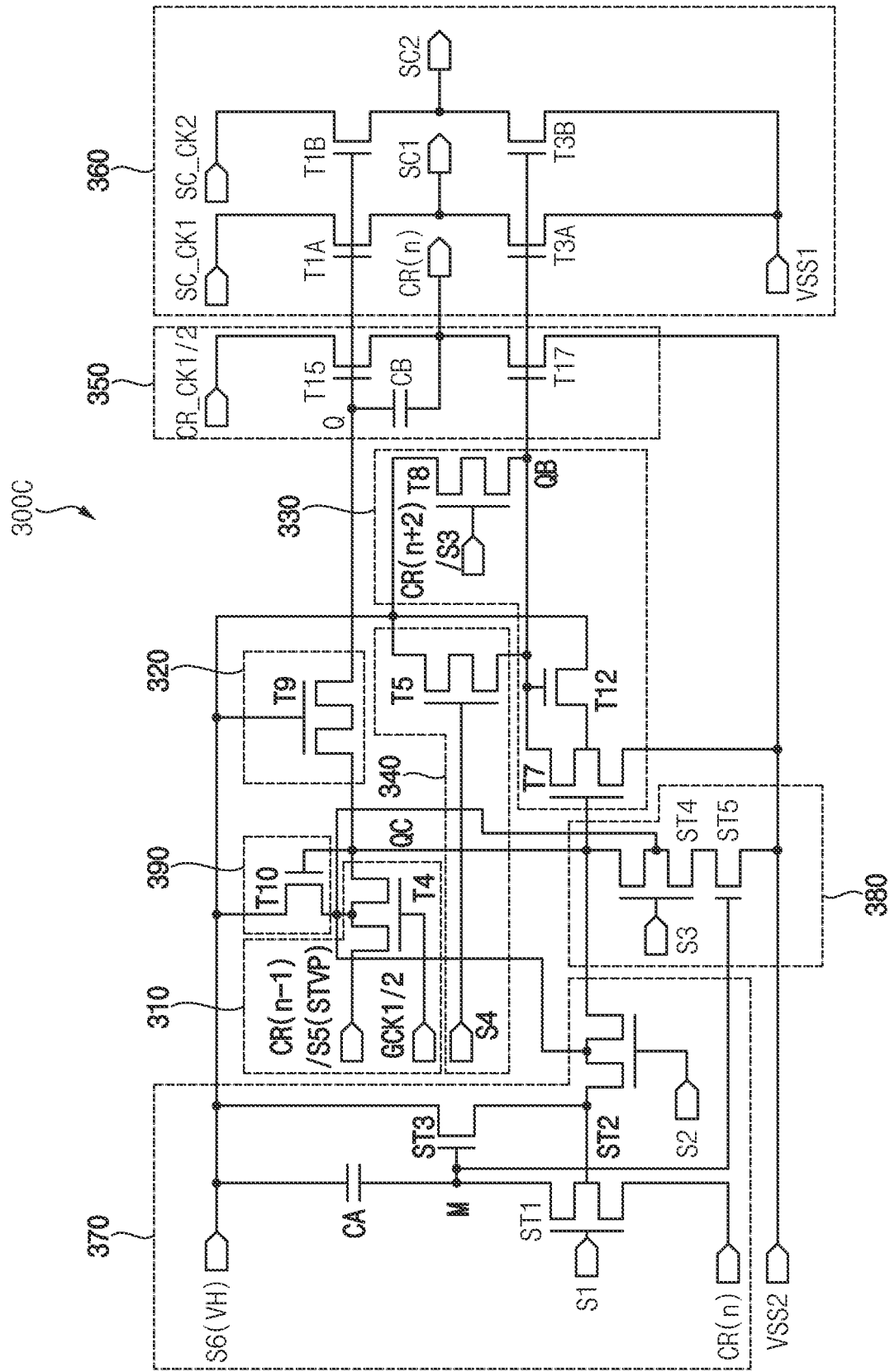
FIG. 8 is a circuit diagram illustrating a gate driving circuit of a gate driver of a display apparatus according to some embodiments of the present inventive concept.

FIG. 8 is a circuit diagram illustrating a gate driving circuit of a gate driver 3000 of a display apparatus according to some embodiments of the present inventive concept.

The gate driver and the display apparatus according to the present embodiments is substantially the same as the gate driver and the display apparatus of the previous embodiments explained referring to FIGS. 1 to 5 except that the gate output circuit outputs two gate signals. Thus, the same reference numerals will be used to refer to the same or like parts as those described in the previous embodiments of FIGS. 1 to 5 and any repetitive explanation concerning the above elements will be omitted.

Referring to FIGS. 1, 3 to 5 and 8, the gate driving circuit includes a pull-up control circuit 310, a pull-down control circuit 330, a carry output circuit 350 and a gate output circuit 360.

The pull-up control circuit 310 may control a voltage of a pull-up control node QC or Q in response to a pull-up control circuit GCK1/GCK2. The pull-down control circuit 330 may control a pull-down control node QB in response to the voltage of the pull-up control node QC or Q. The carry output circuit 350 may output a carry signal CR(n) in response to the voltage of the pull-up control node QC or Q and the voltage of the pull-down control node QB. The gate output circuit 360 may output a plurality of gate signals SC1 and SC2 having different timings in response to the voltage of the pull-up control node QC or Q and the voltage of the pull-down control node QB.

According to some embodiments, for example, the gate output circuit 360 of the gate driving circuit may include two output buffers and output two gate signals SC1 and SC2 using the two output buffers.

For example, the gate output circuit 360 may include a 1A switching element T1A including a control electrode connected to the pull-up control node QC or Q, an input electrode receiving a first gate clock signal SC_CK1 and an output electrode connected to a first gate output node, a 3A switching element T3A including a control electrode connected to the pull-down control node QB, an input electrode receiving a first low power voltage VSS1 and an output electrode connected to the first gate output node, a 1 B switching element T1B including a control electrode connected to the pull-up control node QC or Q, an input electrode receiving a second gate clock signal SC_CK2 having a timing different from a timing of the first gate clock signal SC_CK1 and an output electrode connected to a second gate output node and a 3B switching element T3B including a control electrode connected to the pull-down control node QB, an input electrode receiving the first low power voltage VSS1 and an output electrode connected to the second gate output node.

According to some embodiments, a width of the carry signal CR(n) may be greater than a width of each of the gate signals SC1 and SC2.

According to some embodiments, a number of the carry clock signals CR_CK1 and CR_CK2 is fixed even when a number of the gate clock signals SC_CK1 and SC_CK2 increases so that a number of signal lines of the gate driving circuit may be minimized. Thus, the dead space of the display apparatus may be reduced.

In addition, the gate driving circuit according to the present inventive concept includes fewer transistors than conventional gate driving circuits so that the dead space of the display apparatus may be reduced.

In addition, the carry signal CR(n−1) of the previous stage is applied to the input electrode of the fourth switching element T4 and the additional control signal GCK1/GCK2 is applied to the control electrode of the fourth switching element T4 so that the reliability of the gate driving circuit may be enhanced.

In addition, the low level of the gate clock signal SC_CK1 and SC_CK2 may be set to be greater than the low level of the carry clock signal CR_CK1 and CR_CK2 so that the reliability of the gate pull-up switching element T1A and T1B may be enhanced. The low level of the carry clock signal CR_CK1 and CR_CK2 may define the low level of the voltage of the pull-up control node QC or Q. When the low level of the gate clock signal SC_CK1 and SC_CK2 is greater than the low level of the carry clock signal CR_CK1 and CR_CK2, the gate-source voltages VGS of the 1A switching element T1A and the 1B switching element T1B may be negative respectively in turned-off states of the 1A switching element T1A and the 1B switching element T1B. When the gate-source voltages VGS of the 1A switching element T1A and the 1B switching element T1B are negative in the turned-off states of the 1A switching element T1A and the 1B switching element T1B, the turned-off states of the 1A switching element T1A and the 1B switching element T1B may be stably maintained. Particularly, the turned-off states of the 1A switching element T1A and the 1B switching element T1B may be stably maintained even when the threshold voltages of the 1A switching element T1A and the 1B switching element T1B shift negatively. Thus, the reliability of the 1A switching element T1A and the 1B switching element T1B may be enhanced.

In addition, the low level of the carry clock signal CR_CK1 and CR_CK2 may be set to be greater than the low level of the pull-up control signal GCK1/GCK2 applied to the control electrode of the fourth switching element T4 so that the reliability of the fourth switching element may be enhanced. The low level of the carry clock signal CR_CK1 and CR_CK2 may define the low level of the previous carry signal CR(n−1). When the low level of the previous carry signal CR(n−1) is greater than the pull-up control signal GCK1/GCK2, the gate-source voltages VGS of the fourth switching element T4 may be negative in turned-off state of the fourth switching element T4. When the gate-source voltages VGS of the fourth switching element T4 is negative in the turned-off state of the fourth switching element T4, the turned-off state of the fourth switching element T4 may be stably maintained. Particularly, the turned-off state of the fourth switching element T4 may be stably maintained even when the threshold voltage of the fourth switching element T4 shifts negatively. Thus, the reliability of the fourth switching element T4 may be enhanced.

According to the gate driving circuit and the display apparatus in the present inventive concept, the number of the signal lines and the number of the transistors may be reduced so that the dead space of the display apparatus may be reduced. In addition, the signal applied to the switching element of the gate driving circuit may be controlled so that the reliability of the gate driving circuit may be enhanced.

The foregoing is illustrative of the present inventive concept and is not to be construed as limiting thereof. Although a few embodiments of the present inventive concept have been described, those skilled in the art will readily appreciate that many modifications are possible in the embodiments without materially departing from the novel teachings and characteristics of embodiments according to the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific embodiments disclosed, and that modifications to the disclosed embodiments, as well as other embodiments, are intended to be included within the scope of the appended claims. The present inventive concept is defined by the following claims, with equivalents of the claims to be included therein.

What is claimed is:

1. A gate driving circuit comprising:
    a pull-up control circuit configured to control a voltage of a pull-up control node in response to a pull-up control signal;
    a pull-down control circuit configured to control a voltage of a pull-down control node in response to the voltage of the pull-up control node;
    a carry output circuit configured to output a carry signal in response to the voltage of the pull-up control node and the voltage of the pull-down control node; and
    a gate output circuit configured to output a plurality of gate signals having different timings in response to the voltage of the pull-up control node and the voltage of the pull-down control node,
    wherein a width of the carry signal is greater than a width of each of the gate signals.

2. The gate driving circuit of claim 1, wherein the pull-up control circuit comprises a fourth switching element including a control electrode configured to receive the pull-up control circuit, an input electrode configured to receive a previous carry signal which is one of carry signals of previous stages and an output electrode connected to the pull-up control node.

3. The gate driving circuit of claim 2, wherein an active pulse is included in an active period of the previous carry signal.

4. The gate driving circuit of claim 3, wherein a low level of the previous carry signal is greater than a low level of the pull-up control signal.

5. The gate driving circuit of claim 2, wherein the fourth switching element comprises two transistors connected to each other in series,
    further comprising a tenth switching element including a control electrode connected to the pull-up control node, an input electrode configured to receive a high-power voltage and an output electrode connected to an intermediate node of the two transistors of the fourth switching element which are connected to each other in series.

6. The gate driving circuit of claim 1, wherein the pull-down control circuit comprises:
    a seventh switching element including a control electrode connected to the pull-up control node, an input electrode configured to receive a second low power voltage and an output electrode connected to the pull-down control node; and
    an eighth switching element including a control electrode configured to receive a next carry signal which is one of carry signals of next stages, an input electrode configured to receive a high-power voltage and an output electrode connected to the pull-down control node.

7. The gate driving circuit of claim 6, wherein the seventh switching element comprises two transistors connected to each other in series, and
    wherein the pull-down control circuit further comprises a twelfth switching element including a control electrode connected to the pull-down control node, an input electrode configured to receive the high-power voltage and an output electrode connected to an intermediate node of the two transistors of the seventh switching element which are connected to each other in series.

8. The gate driving circuit of claim 6, further comprising a fifth switching element including a control electrode configured to receive a fourth control signal, an input electrode configured to receive the high-power voltage and an output electrode connected to the pull-down control node.

9. The gate driving circuit of claim 1, wherein the carry output circuit comprises:
    a fifteenth switching element including a control electrode connected to the pull-up control node, an input electrode configured to receive a carry clock signal and an output electrode connected to a carry output node;
    a seventeenth switching element including a control electrode connected to the pull-down control node, an input electrode configured to receive a second low power voltage and an output electrode connected to the carry output node; and
    a boosting capacitor including a first end connected to the control electrode of the fifteenth switching element and a second end connected to the carry output node.

10. The gate driving circuit of claim 9, wherein a duty ratio of the carry clock signal is greater than 50%.

11. The gate driving circuit of claim 1, wherein the gate output circuit comprises:
    a 1A switching element including a control electrode connected to the pull-up control node, an input electrode configured to receive a first gate clock signal and an output electrode connected to a first gate output node;
    a 3A switching element including a control electrode connected to the pull-down control node, an input electrode configured to receive a first low power voltage and an output electrode connected to the first gate output node;
    a 1B switching element including a control electrode connected to the pull-up control node, an input electrode configured to receive a second gate clock signal having a timing different from a timing of the first gate clock signal and an output electrode connected to a second gate output node; and
    a 3B switching element including a control electrode connected to the pull-down control node, an input electrode configured to receive the first low power voltage and an output electrode connected to the second gate output node.

12. The gate driving circuit of claim 11, wherein the gate output circuit further comprises:
    a 1C switching element including a control electrode connected to the pull-up control node, an input electrode configured to receive a third gate clock signal having a timing different from the timings of the first gate clock signal and the second gate clock signal and an output electrode connected to a third gate output node;
    a 3C switching element including a control electrode connected to the pull-down control node, an input electrode configured to receive the first low power voltage and an output electrode connected to the third gate output node;

a 1 D switching element including a control electrode connected to the pull-up control node, an input electrode configured to receive a fourth gate clock signal having a timing different from the timings of the first gate clock signal, the second gate clock signal and the third gate clock signal and an output electrode connected to a fourth gate output node; and a 3D switching element including a control electrode connected to the pull-down control node, an input electrode receiving the first low power voltage and an output electrode connected to the fourth gate output node.

13. The gate driving circuit of claim 1, wherein a low level of gate clock signals applied to the gate output circuit is greater than a low level of a carry clock signal applied to the carry output circuit.

14. The gate driving circuit of claim 1, further comprising a ninth switching element including a control electrode configured to receive a high-power voltage, an input electrode connected to a first pull-up control node and an output electrode connected to a second pull-up control node.

15. The gate driving circuit of claim 1, further comprising a line selecting circuit configured to select a gate line of a stage that has the carry signal having an active level as a sensing gate line based on a first control signal.

16. The gate driving circuit of claim 15, wherein the line selecting circuit comprises:
a first sensing switching element including a control electrode configured to receive the first control signal, an input electrode configured to receive the carry signal and an output electrode connected to an M node;
a second sensing switching element including a control electrode configured to receive a second control signal, an input electrode connected to an output electrode of a third sensing switching element and an output electrode connected to the pull-up control node;
the third sensing switching element including a control electrode connected to the M node, an input electrode configured to receive a high-power voltage and the output electrode connected to the input electrode of the second sensing switching element; and
a first capacitor including a first end configured to receive the high-power voltage and a second end connected to the M node.

17. The gate driving circuit of claim 16, wherein the second sensing switching element comprises two transistors connected to each other in series,
further comprising a tenth switching element including a control electrode connected to the pull-up control node, an input electrode configured to receive the high-power voltage and an output electrode connected to an intermediate node of the two transistors of the second sensing switching element which are connected to each other in series.

18. The gate driving circuit of claim 15, further comprising a line discharging circuit configured to discharge the pull-up control node corresponding to the sensing gate line based on a third control signal.

19. The gate driving circuit of claim 18, wherein the line discharging circuit comprises:
a fifth sensing switching element including a control electrode connected to M node, an input electrode configured to receive a second low power voltage and an output electrode connected to an input electrode of a fourth sensing switching element; and
the fourth sensing switching element including a control electrode configured to receive the third control signal, the input electrode connected to the output electrode of the fifth sensing switching element and an output electrode connected to the pull-up control node.

20. The gate driving circuit of claim 19, wherein the fourth sensing switching element comprises two transistors connected to each other in series,
further comprising a tenth switching element including a control electrode connected to the pull-up control node, an input electrode configured to receive a high-power voltage and an output electrode connected to an intermediate node of the two transistors of the fourth sensing switching element which are connected to each other in series.

21. A display apparatus comprising:
a display panel;
a gate driver configured to output a gate signal to the display panel; and
a data driver configured to output a data voltage to the display panel;
wherein a gate driving circuit of the gate driver comprises:
a pull-up control circuit configured to control a voltage of a pull-up control node in response to a pull-up control signal;
a pull-down control circuit configured to control a voltage of a pull-down control node in response to the voltage of the pull-up control node;
a carry output circuit configured to output a carry signal in response to the voltage of the pull-up control node and the voltage of the pull-down control node; and
a gate output circuit configured to output a plurality of the gate signals having different timings in response to the voltage of the pull-up control node and the voltage of the pull-down control node, and
wherein a width of the carry signal is greater than a width of each of the gate signals.

* * * * *